United States Patent
Yokotani et al.

[11] Patent Number: 6,014,023
[45] Date of Patent: Jan. 11, 2000

[54] HIGH RESOLUTION MAGNETORESISTANCE SENSING DEVICE WITH ACCURATE PLACEMENT OF INDUCING AND DETECTING ELEMENTS

[75] Inventors: Masahiro Yokotani; Naoki Hiraoka, both of Tokyo, Japan

[73] Assignee: Mitsubishi Denki Kabushiki Kaisha, Tokyo, Japan

[21] Appl. No.: 08/891,036

[22] Filed: Jul. 10, 1997

[30] Foreign Application Priority Data

Feb. 26, 1997 [JP] Japan .................................. 9-042302

[51] Int. Cl.⁷ .............................. G01B 7/30; G01R 33/09
[52] U.S. Cl. ................................ 324/207.21; 324/207.25; 324/252
[58] Field of Search .................................. 324/173, 174, 324/207.2, 207.21, 207.25, 252; 338/32 R

[56] References Cited

U.S. PATENT DOCUMENTS

| | | | |
|---|---|---|---|
| 4,524,932 | 6/1985 | Bodziak | 324/207.2 X |
| 4,712,064 | 12/1987 | Eckardt et al. | 324/252 X |
| 5,038,130 | 8/1991 | Eck et al. | 324/207.21 X |
| 5,115,194 | 5/1992 | Luetzow et al. | 324/207.2 |
| 5,477,143 | 12/1995 | Wu | 324/252 X |
| 5,744,950 | 4/1998 | Seefeldt | 324/174 X |
| 5,801,529 | 9/1998 | Umemoto et al. | 338/32 R X |

FOREIGN PATENT DOCUMENTS

| | | |
|---|---|---|
| 3426784 A1 | 1/1986 | Germany . |
| 43 41 890 A1 | 6/1994 | Germany . |
| 195 80 095 C2 | 2/1996 | Germany . |
| WO 96/22543 | 7/1996 | WIPO . |

*Primary Examiner*—Gerard Strecker
*Attorney, Agent, or Firm*—Sughrue, Mion, Zinn, Macpeak & Seas, PLLC

[57] ABSTRACT

A sensing device outputs a signal which exactly corresponds to a predetermined position (angle) such as a protruding or recessed portion of a moving magnetic material member as soon as electric power to the sensing device is turned on. The sensing device includes: a magnet for generating a magnetic field; a rotary magnetic material member for changing the magnetic field generated by the magnet, the rotary magnetic material member being disposed a predetermined distance apart from the magnet; a plurality of magnetic field detecting elements which change in resistance in response to the magnetic field whose magnitude is changed by the rotary magnetic material member; wherein the plurality of magnetic field detecting elements are disposed so that the center of the gap between the magnetic field detecting elements is not coincident in location with the center of the magnet.

17 Claims, 15 Drawing Sheets

(a)

(b)

FIG. 4A
FIG. 4B
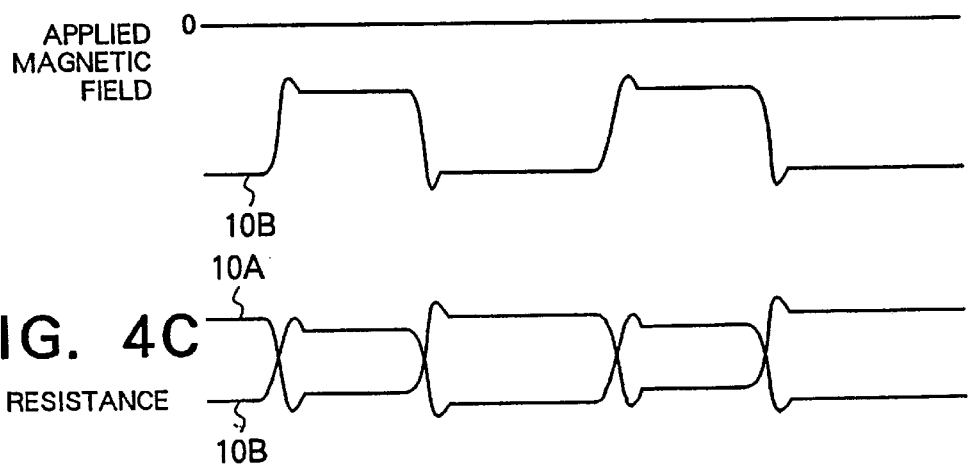
APPLIED MAGNETIC FIELD
FIG. 4C
RESISTANCE
FIG. 4D
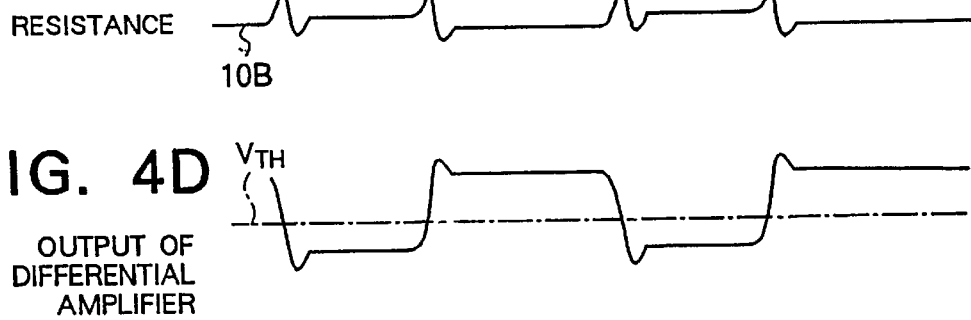
OUTPUT OF DIFFERENTIAL AMPLIFIER
FIG. 4E
OUTPUT OF "1" WAVEFORM SHAPING "0" CIRCUIT

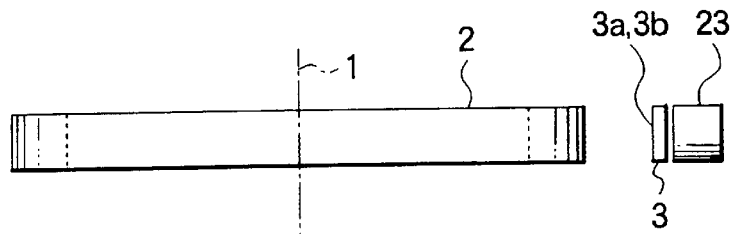
FIG. 6A
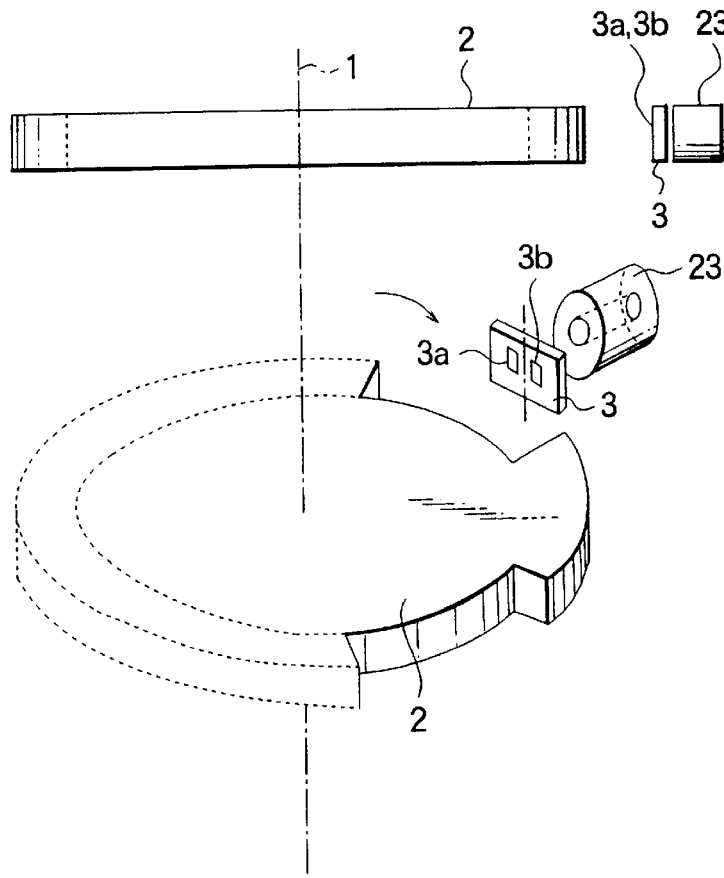
FIG. 6B
FIG. 7
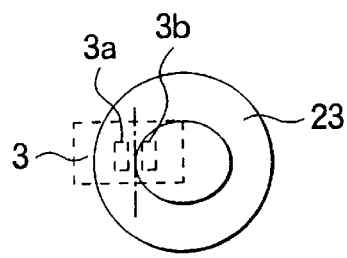

CENTER OF RING-SHAPED MAGNET 3a  3b   CENTER OF RING-SHAPED MAGNET

CENTER OF
RING-SHAPED MAGNET

FIG. 14
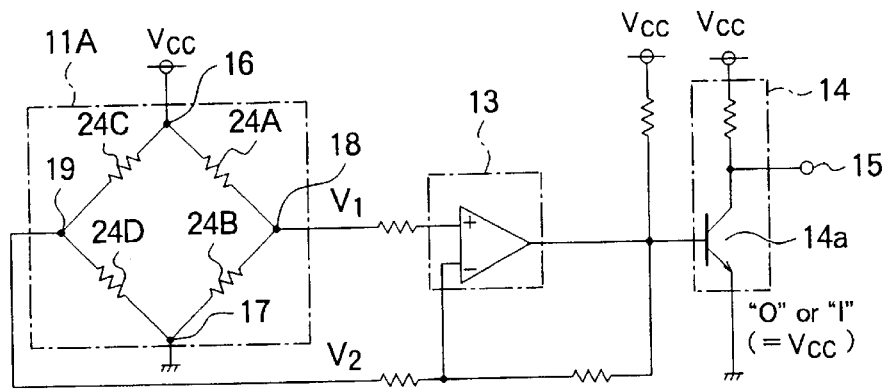
FIG. 15A
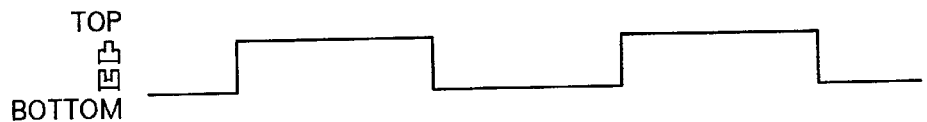
FIG. 15B
FIG. 15C
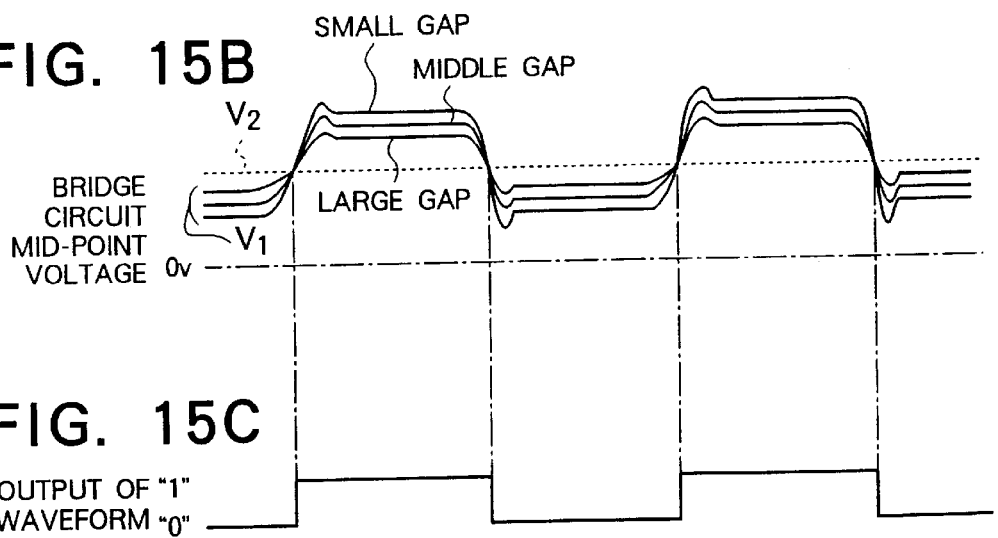

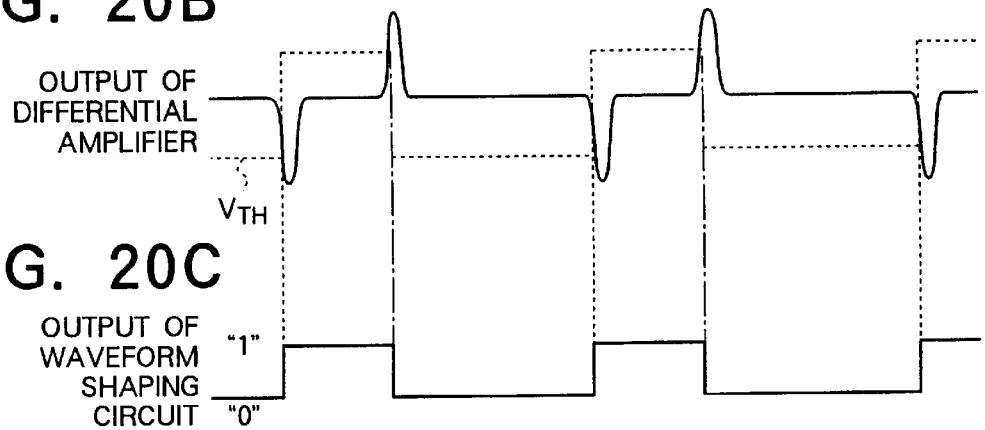
FIG. 20A
FIG. 20B
FIG. 20C
FIG. 21
PRIOR ART
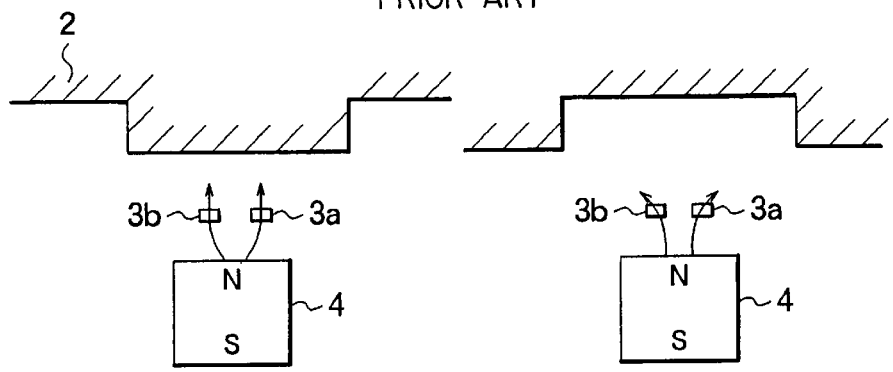

HIGH RESOLUTION MAGNETORESISTANCE SENSING DEVICE WITH ACCURATE PLACEMENT OF INDUCING AND DETECTING ELEMENTS

BACKGROUND OF THE INVENTION

1. Field of the Invention

The present invention relates to a sensing device for detecting a change in an applied magnetic field, and more particularly, to a sensing device which is particularly suitable for detecting the information about the rotation of, for example, an internal combustion engine.

2. Description of the Related Art

In a one known technique of detecting a change in magnetic field, electrodes are formed on either end of the magnetic field sensing plane of a magnetic field sensing element, and connection is made in such a manner as to form a bridge circuit, wherein the two opposite nodes of the bridge circuit are connected to a constant voltage source or a constant current source, whereby a change in the resistance of the magnetic sensing element is converted into a change in voltage, thereby detecting the change in the magnetic field.

FIG. 18 is a schematic diagram illustrating a conventional sensing device using a magnetoresistance (MR) element as the magnetic field sensing element, wherein FIG. 18A is a side view thereof and FIG. 18B is a perspective view.

This sensing device includes: a rotating shaft 1; a rotary magnetic material member 2 having at least one protruding or recessed portion and being adapted to rotate in synchronization with the rotation of the rotating shaft 1; a magnetoresistance element 3 disposed at a location a predetermined distance from the rotary magnetic material member 2; and a magnet 4 for applying a magnetic field to the magnetoresistance element 3, wherein the magnetoresistance element 3 includes magnetoresistance patterns 3a and 3b formed on a thin film plane (magnetic field sensing plane).

When the rotary magnetic material member 2 rotates, the magnetic field applied to the magnetic field sensing plane of the magnetoresistance element 3 changes. In response to the change in the magnetic field, the resistance of the magnetoresistance patterns 3a and 3b changes.

FIG. 19 is a block diagram illustrating a conventional sensing device using an MR element of the above-described type.

This sensing device includes: a Wheatstone bridge circuit 11 including magnetoresistance elements disposed a predetermined distance from the rotary magnetic material member 2 so that a magnetic field is applied from a magnet 4 to the magnetoresistance elements; a differential amplifier 12 for amplifying the output signal of the Wheatstone bridge circuit 11; a comparator 13 for comparing the output of the differential amplifier 12 with a reference value $V_{TH}$ and outputting a "0" signal or a "1" signal depending on the comparison result; a holding circuit 20 for holding the output of the comparator 13; and a waveform shaping circuit 14 for shaping the waveform of the output of the holding circuit 20 and supplying a "0" or "1" signal having sharply rising and falling edges to the output terminal 15.

The operation will be described below with reference to FIG. 20.

If the rotary magnetic material member 2 rotates, the magnetic field applied to the MR elements constituting the Wheatstone bridge circuit changes in response to the passage of the protruding and recessed portions of the rotary magnetic material member 2 as shown in FIG. 20A. As a result, the magnetic field sensing planes of the MR elements experience the change in the magnetic field corresponding to the protruding and recessed portions of the rotary magnetic material member 2. In response to the above change in the magnetic field, a change occurs in the mid-point voltage of the Wheatstone bridge circuit.

The difference between the mid-point voltages is amplified by the differential amplifier 12. Thus, as shown in FIG. 20B, the differential amplifier 12 outputs a signal corresponding to the passage of the protruding and recessed portions of the rotary magnetic material member 2 shown in FIG. 20A.

The output signal of the differential amplifier 12 is supplied to the comparator 13 which in turn compares the output signal of the differential amplifier 12 with the reference voltage $V_{TH}$ and outputs a "0" or "1" signal in response to the comparison result. After the output signal of the comparator is temporarily held by the holding circuit 20, it is shaped by the waveform shaping circuit 14 so that a "0" or "1" output signal having sharply rising and falling edges is obtained via the output terminal 15 as shown in FIG. 20C.

However, the conventional sensing device having the above construction has the following problems.

In the conventional sensing device, as shown in FIG. 21, a magnetic field is applied to a magnetoresistance pattern of a magnetic circuit in such a direction that when the magnet 4 faces a protruding portion of the rotary magnetic material member 2 as shown on the left of FIG. 21 (wherein N and S denote north and south poles of the magnet), the magnetic field emerging from the magnet 4 reaches the rotary magnetic material member 2 in a converging fashion after passing through magnetoresistance patterns 3a and 3b. In this case, both magnetoresistance patterns 3a and 3b have an equal resistance. When the magnet 4 faces a recessed portion of the rotary magnetic material member 2, although the magnetic field emerging from the magnet 4 reaches the rotary magnetic material member 2 in a diverging fashion, the magnetic field equally passes through the magnetoresistance patterns 3a and 3b, and therefore both the magnetoresistance patterns 3a and 3b have an equal resistance.

Thus, as shown in FIG. 21, no difference occurs in resistance between the magnetoresistance patterns 3a and 3b during the operation of detecting the change in the magnetic field corresponding to the protruding and recessed portions of the rotary magnetic material member 2. Therefore, as shown in FIG. 20, in the operation of detecting the protruding and recessed portions of the rotary member of magnetic material 2, the output of the differential amplifier 12 changes at the edges of the protruding and recessed portions wherein the output of the differential amplifier 12 has the same level for both the protruding and recessed portions. As a result, it is required to detect the edges and hold the detected signal by the holding circuit 20.

Another reason for the above problem is that the MR elements used in the conventional sensing device have no hysteresis in the characteristic of resistance versus applied magnetic field as shown in FIG. 22.

Since there in no difference in the output of the differential amplifier 12 between the protruding and recessed portions of the rotary member 2, it is impossible to obtain a signal exactly corresponding to the protruding and recessed portions of the rotary magnetic material member for a period just after the electric power to the sensing device is turned on (the ability of starting a precise operation immediately after the power is turned on will be referred to as "quick starting capability").

As described above, the problem of the conventional sensing device is that it is impossible to obtain a signal exactly corresponding to the protruding and recessed portions of the rotary magnetic material member. Another problem is that it is impossible to start a correct operation immediately after the electric power is turned on.

In view of the above, it is an object of the present invention to provide a sensing device capable of obtaining an output signal exactly corresponding to a predetermined position (angle), such as for a protruding or recessed portion of a rotary magnetic material member, and also having the quick starting capability.

SUMMARY OF THE INVENTION

According to one aspect of the invention, there is provided a sensing device including: magnetic field generation means for generating a magnetic field; magnetic field variation inducing means for changing the magnetic field generated by the magnetic field generation means, the magnetic field variation inducing means being disposed at a predetermined distance from the magnetic field generation means; and a plurality of magnetic field detecting elements which change in resistance in response to the magnetic field whose magnitude is changed by the magnetic field variation inducing means, wherein the plurality of magnetic field detecting elements are disposed so that the center of the gap between the magnetic field detecting elements is not coincident in location with the center of the magnetic field generating means.

With this construction, it is possible to obtain a signal exactly corresponding to a predetermined portion of the magnetic field variation inducing means as soon as the electric power of the sensing device is turned on, without having to use a holding circuit required in the conventional technique. Thus it is possible to achieve a quick starting operation with high reliability.

In one form of the invention, the magnetic field detecting elements are disposed at a location shifted in a forward direction of the motion of the magnetic field variation inducing means.

According to this arrangement, it is possible to obtain a signal more exactly corresponding to a predetermined portion of the magnetic field variation inducing means as soon as the electric power of the sensing device is turned on, without having to use a holding circuit which is required in the conventional technique. Thus it is possible to achieve a quick starting operation with higher reliability.

In another form of the invention, the magnetic field generating means includes a plurality of magnets, and the plurality of magnets are located such that the center of the gap between the plurality of magnetic field detecting elements is coincident in location with an end of one of the plurality of magnets, the above end facing an end of another magnet.

According to this arrangement, it becomes possible to obtain a signal exactly corresponding to the shape of the magnetic field variation inducing means without having to detect an edge corresponding to the shape of the magnetic field variation inducing means and without having to use a holding circuit as for the conventional technique. Furthermore, in this arrangement, it is possible to achieve a quick starting operation with high reliability.

In another form of the invention, the magnetic field generating means includes a single ring-shaped magnet and the plurality of magnetic field detecting elements are disposed so that the center of the gap between the magnetic field detecting elements is coincident in location with an inner peripheral edge of the ring-shaped magnet.

According to this arrangement, it becomes possible to obtain a signal exactly corresponding to the shape of the magnetic field variation inducing means without having to detect an edge corresponding to the shape of the magnetic field variation inducing means and without having to use a holding circuit as for the conventional technique. Furthermore, in this arrangement, it is possible to achieve a quick starting operation with high reliability. And, since only one magnet is required, the sensing device can be implemented in a small size.

In a further form of the invention, the magnetic field generating means includes a single ring-shaped magnet and the plurality of magnetic field detecting elements are spaced from each other by an amount equal to the inner diameter of the ring-shaped magnet and disposed in such a manner that one of the plurality of magnetic field detecting elements is located at a position shifted slightly outward from an inner peripheral edge of the ring-shaped magnet and the other element is located at a position shifted slightly inward from the inner peripheral edge.

According to this arrangement, it becomes possible to obtain a signal exactly corresponding to the shape of the magnetic field variation inducing means without having to detect an edge corresponding to the shape of the magnetic field variation inducing means and without having to use a holding circuit as for the conventional technique. Furthermore, in this arrangement, it is possible to achieve a quick starting operation with high reliability. And, since only one magnet is required, the sensing device can be implemented in a small size. This arrangement also provides a greater margin associated with the positioning error of the magnetic field detecting elements relative to the location of the ring-shaped magnet.

In a further form of the invention, a bridge circuit is formed using said plurality of magnetic field detecting elements so that the polarity of a magnetic field applied to one magnetic field detecting element disposed on one branch of the bridge circuit is opposite to that applied to another magnetic field detecting element.

According to this arrangement, it becomes possible to obtain a signal exactly corresponding to the shape of the magnetic field variation inducing means without having to detect an edge corresponding to the shape of the magnetic field variation inducing means and without having to use a holding circuit as for the conventional technique. Furthermore, in this arrangement, it is possible to achieve a quick starting operation with high reliability.

In a still another form of the invention, a bridge circuit is formed using a plurality of giant magnetoresistance elements serving as the plurality of magnetic field detecting elements, so that the polarity of a magnetic field applied to one giant magnetoresistance element disposed on one branch of the bridge circuit is opposite to that applied to another giant magnetoresistance element.

According to this arrangement, it becomes possible to obtain a high-level signal exactly corresponding to the shape of the magnetic field variation inducing means without having to detect an edge corresponding to the shape of the magnetic field variation inducing means and without having to use a holding circuit as for the conventional technique. This allows an improvement in detection accuracy. Furthermore, in this arrangement, it is possible to achieve a quick starting operation with high reliability.

In another form of the invention, there is further provided a signal processing means for processing a signal output by said bridge circuit.

According to this arrangement, it becomes possible to obtain a high-accuracy signal exactly corresponding to the shape of the magnetic field variation inducing means.

In a further form of the invention, the signal processing means comprises at least: a comparator for comparing a plurality of output signals of the bridge circuit with each other; and waveform shaping means for shaping the waveform of the output signal of the comparator.

According to this arrangement, it becomes possible to realize the circuit of the sensing device in a simple form.

In still another form of the invention, the magnetic field variation inducing means comprises a rotary magnetic material member having at least one protruding or recessed portion.

According to this arrangement, it becomes possible to detect a small protruding or recessed portion. This allows an improvement in the detection accuracy. Furthermore, it also becomes possible to realize a sensing device in a small-sized fashion at low cost.

BRIEF DESCRIPTION OF THE DRAWINGS

FIGS. 4A–4E are waveform diagrams illustrating the operation of the first embodiment of the sensing device according to the present invention;

FIGS. 6A and 6B are schematic diagrams illustrating a second embodiment of a sensing device according to the present invention;

FIG. 7 is a schematic diagram illustrating the location of a magnetic field detecting element relative to the location of a ring-shaped magnet according to the second embodiment of the invention;

FIG. 14 is a specific example of the circuit shown in FIG. 13;

FIGS. 15A–15C are waveform diagrams illustrating the operation of a sensing device according to a fourth embodiment of the invention;

FIGS. 20A–20C are waveform diagrams illustrating the operation of the sensing device shown in FIG. 19;

FIG. 21 is a schematic diagram illustrating changes in magnetic field vectors in the conventional sensing device.

DESCRIPTION OF THE PREFERRED EMBODIMENTS

The sensing device of the present invention will be described in further detail below with reference to preferred embodiments in conjunction with the drawings.

Embodiment 1

Figure 1A:
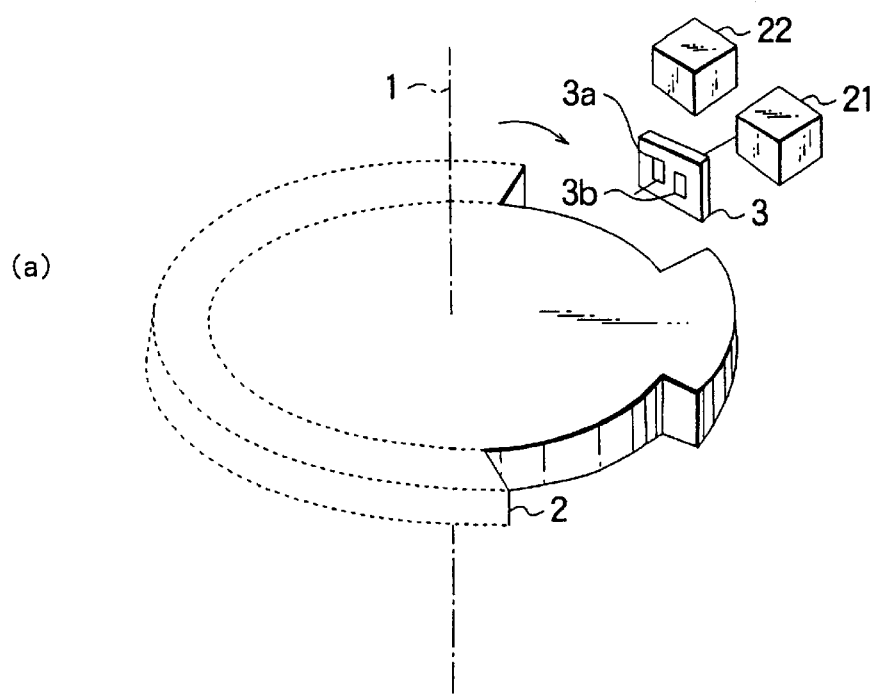
FIGS. 1A and 1B are schematic diagrams illustrating a first embodiment of a sensing device according to the present invention.
Figure 1B:
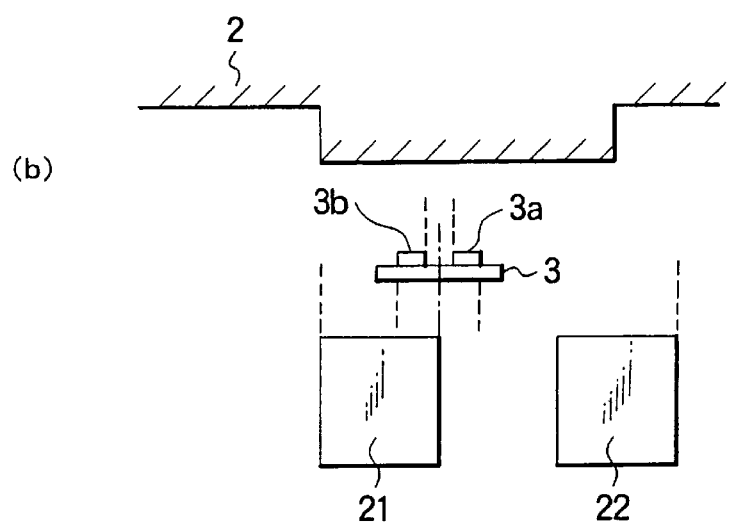

FIG. 1 is a schematic diagram illustrating a first embodiment of a sensing device according to the present invention, wherein FIGS. 1A and 1B are a side view and a perspective view thereof, respectively, in which similar elements and parts to those in FIG. 18 are denoted by similar reference numerals, and are not described here in further detail.

This sensing device includes: a rotating shaft 1; a rotary magnetic material member 2 serving as magnetic field variation inducing means having at least one protruding or recessed portion and being adapted to rotate in synchronization with the rotation of the rotating shaft 1; a magnetic field detecting element such as an MR element 3 disposed at a location a predetermined distance from the rotary magnetic material member 2; and magnets 21 and 22 serving as magnetic field generating means for applying a magnetic field to the MR element 3. If it is assumed here that the rotary magnetic material member 2 rotates clockwise as shown in FIG. 1, the MR element 3 is disposed at a location shifted in a forward direction of the rotating motion. More specifically, the MR element 3 is disposed such that the center of the gap between the magnetoresistance patterns 3a and 3b is coincident in location with the end of the magnet 21 facing an end of the other magnet 22.

In this structure, if the rotary member of magnetic material 2 rotates, the magnetic field sensing plane of the MR element 3 experiences a change in the magnetic field, and a corresponding change occurs in the resistance of the magnetoresistance patterns 3a and 3b.

Figure 2:
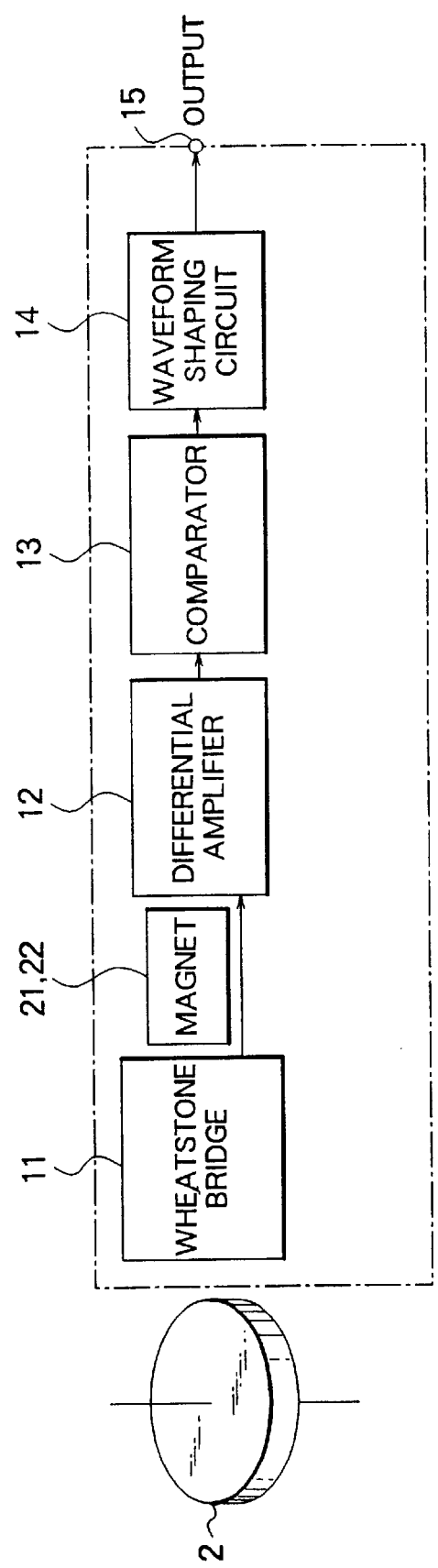
FIG. 2 is a block diagram illustrating the circuit configuration of the first embodiment of the sensing device according to the present invention.

FIG. 2 is a block diagram illustrating an example of the circuit configuration of the sensing device using the MR element.

This sensing device includes: a Wheatstone bridge circuit 11 including MR elements disposed a predetermined distance apart from the rotary magnetic material member 2 so that a magnetic field is applied from magnets 21 and 22 to the MR elements; a differential amplifier 12 for amplifying the output signal of the Wheatstone bridge circuit 11; a comparator 13 for comparing the output of the differential amplifier 12 with a reference value and outputting a "0" signal or a "1" signal depending on the comparison result; a waveform shaping circuit 14 for shaping the waveform of the output of the comparator 13 and supplying a "0" or "1" signal having sharply rising and falling edges to an output terminal 15. The above differential amplifier 12, comparator 13, and waveform shaping circuit 14 form a signal processing means.

Figure 3:
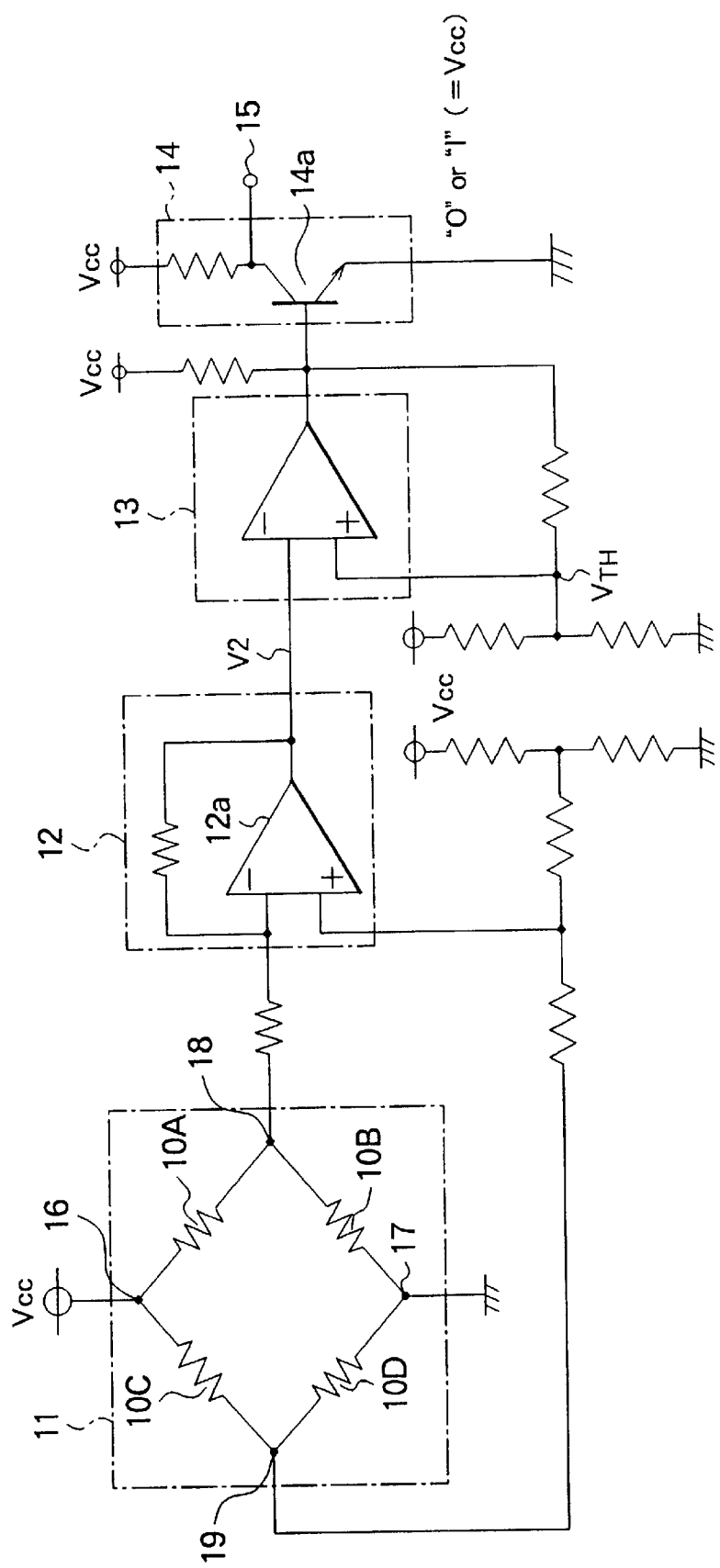
FIG. 3 is a circuit diagram illustrating a specific example of the circuit shown in FIG. 2.

FIG. 3 is a circuit diagram illustrating a specific example of the circuit shown in FIG. 2.

The Wheatstone bridge circuit 11 includes MR elements 10A and 10B and fixed resistors 10C and 10D located on the respective branches of the Wheatstone bridge circuit, wherein one end of the MR element 10A and one end of the fixed resistor 10C are connected in common to a power supply terminal $V_{cc}$ via a node 16, one end of the MR element 10B and one end of the fixed resistor 10D are connected in common to ground via a node 17, the other end of the MR element 10A and the other end of the MR element 10B are connected to a node 18, and the other end of the fixed resistor 10C and the other end of the fixed resistor 10D are connected to a node 19. In this sensing device, the MR elements 10A and 10B correspond to the magnetoresistance patterns 3a and 3b of the MR element shown in FIG. 1. Although in the above example the elements 10C and 10D are realized by fixed resistors, they may also be realized using MR elements.

The node 18 of the Wheatstone bridge circuit 11 is connected via a resistor to the inverting input of an amplifier 12a constituting a differential amplifier 12. The node 19 is connected via a resistor to the non-inverting input of the amplifier 12a and further connected via a resistor to a voltage divider serving as a reference power supply.

The output of the amplifier 12a is connected via a resistor to the inverting input of the amplifier 12a itself and also connected to the inverting input of the comparator 13. The non-inverting input of the comparator 13 is connected to a voltage divider serving as a reference power supply and also connected via a resistor to the output of the comparator 13.

The output of the comparator 13 is connected to the base of a transistor 14a of a waveform shaping circuit 14 and also connected via a resistor to the power supply terminal $V_{cc}$. The collector of the transistor 14a is connected to the output terminal 15 and also to the power supply terminal $V_{cc}$ via a resistor. The emitter of the transistor 14a is grounded.

The operation will now be described below with reference to FIG. 4.

If the rotary magnetic material member 2 rotates, the magnetic field applied to the MR elements 10A and 10B changes in response to the passage of the protruding and recessed portions of the rotary magnetic material member 2 shown in FIG. 4A, wherein the magnetic field applied to the MR element 10A is different from that applied to the MR element 10B as shown in FIG. 4B. As a result, the magnetic field sensing planes of the GMR elements 10A and 10B experience the change in the magnetic field corresponding to the protruding and recessed portion of the rotary magnetic material member 2. As a result, the overall magnitude of the change in the magnetic field becomes, in effect, two times greater than can be sensed by a single MR element, and a corresponding change in resistance occurs in each MR element as shown in FIG. 4C. Thus, the MR element 10A has maximum and minimum resistances at locations opposite to those where the MR element 10B has maximum and minimum resistances. As a result, the voltages at the nodes 18 and 19 (mid-point voltages) of the Wheatstone bridge circuit 11 also change in a similar fashion, wherein there is a voltage of great difference between these mid-point voltages.

The direction of a magnetic field vector applied to the magnetoresistance pattern of the magnetic circuit in the present embodiment will be described below with reference to FIG. 5.

Figure 5A:
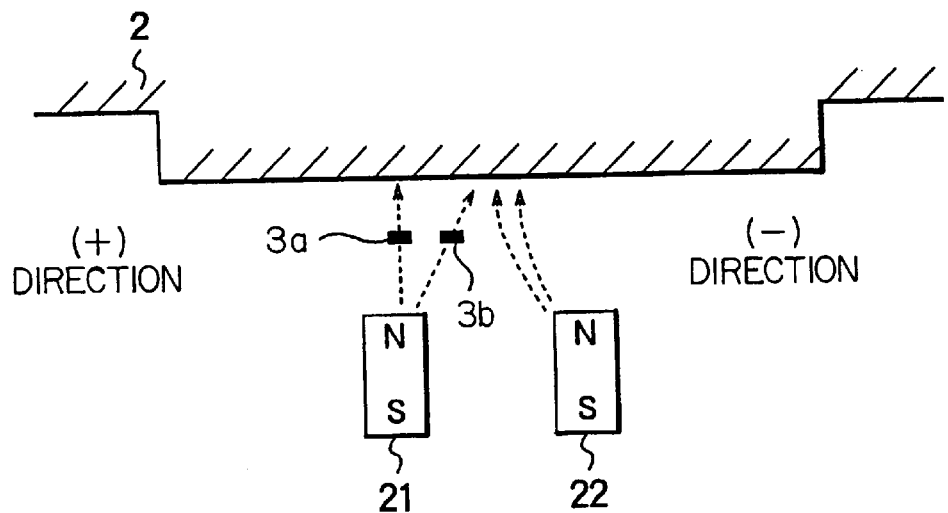
FIGS. 5A and 5B are schematic diagrams illustrating changes in magnetic field vectors which occur in the sensing device of the first embodiment according to the invention.

Since the center of the gap between the magnetoresistance patterns 3a and 3b serving as the MR elements 10A and 10B is located at a position corresponding to an end of the magnet 21 facing the magnet 22, when magnets 21 and 22 face a protruding portion of the rotary magnetic material member 2 as shown in FIG. 5A (wherein N and S denote north and south poles of the magnet), the magnetic field emerging from the magnet 21 reaches the rotary magnetic material member 2 after passing at a right angle through the magnetoresistance pattern 3b and a part of the magnetic field also passes at a slightly slanted angle through the magnetoresistance pattern 3a before arriving at the rotary magnetic material member 2. On the other hand, the magnetic field emerging from the magnet 22 is directly attracted to the rotary magnetic material member 2 without passing through the magnetoresistance patterns 3a and 3b.

Figure 5B:
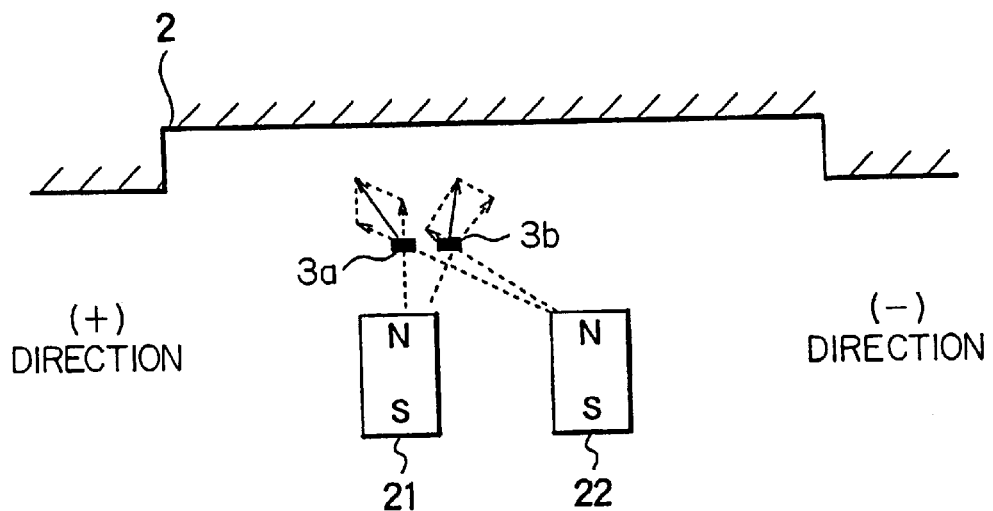

In the case where the magnets 21 and 22 face a recessed portion of the rotary magnetic material member 2 as shown in FIG. 5B, the distance of the magnets 21 and 22 from the rotary magnetic material member 2 becomes greater than when they face a protruding portion, and, thus, mixing occurs between the magnetic fields emerging from the magnets 21 and 22. The mixed magnetic field passes at a slanted angle through the magnetoresistance pattern 3a toward the rotary magnetic material member 2 and the mixed magnetic field passes at a slightly slanted angle through the magnetoresistance pattern 3b toward the rotary magnetic material member 2.

As a result, the magnetic field applied to the magnetoresistance patterns 3a and 3b becomes different for the protruding and recessed portions of the rotary magnetic material member 2. Furthermore, the polarity of the magnetic field applied to the magnetoresistance pattern 3a is opposite to that applied to the magnetoresistance pattern 3b, and therefore the resistances of the magnetoresistance patterns 3a and 3b change in opposite directions. This leads to a great difference in the output voltages of the bridge circuit.

The difference between the mid-point voltages obtained in the above-described manner is amplified by the differential amplifier 12. Thus, as shown in FIG. 4D, the differential amplifier 12 outputs a signal corresponding to the protruding and recessed portions of the rotary magnetic material member 2 as shown in FIG. 4A, wherein the output signal is different in level and polarity for the protruding and recessed portions and, thus, output signal of the differential amplifier 12 is substantially two times greater than can be obtained when a single MR element is used.

The output of the differential amplifier 12 is supplied to the comparator 13, and is compared with the reference value, or threshold value, $V_{TH}$. The comparator 13 outputs a "0" or "1" signal in accordance with the comparison result. The waveform of this signal is then shaped by the waveform shaping circuit 14. As a result, as shown in FIG. 4E, an output signal having a "0" or "1" level with sharply rising and falling edges is obtained via the output terminal 15, wherein the output signal exactly corresponds to the protruding and recessed portions of the rotary magnetic material member 2.

Thus, in the present embodiment, it is possible to obtain a signal exactly corresponding to the protruding and recessed portions of the rotary magnetic material member without having to detect the edges of the protruding and recessed portions of the rotary member and without having to use a holding circuit required in the conventional technique. Furthermore, in the present embodiment, it is possible to obtain an output signal which precisely corresponds to the protruding and recessed portions of the rotary magnetic material member as soon as the electric power of the sensing device is turned on, and, thus, it is possible to achieve a quick starting operation with high reliability.

In the specific embodiment described above, the rotary magnetic material member 2 rotates clockwise and the MR element 3 is disposed at a location shifted in the forward direction of the rotating motion of the rotary magnetic material member 2, i.e., the MR element 3 is located such that the center of the gap between the magnetoresistance patterns 3a and 3b is coincident in location with an end of the magnet 21 facing the magnet 22. Alternatively, the rotary magnetic material member 2 may also rotate counterclockwise and the MR element 3 may be disposed, as in the above case, at a location shifted in the forward direction of the rotating motion of the rotary magnetic material member 2. In this case, however, the MR element 3 is located such that the center of the gap between the magnetoresistance patterns 3a and 3b is coincident in location with an end of the magnet 22 facing the magnet 21.

In the present embodiment, as described above, the sensing device includes a plurality of magnets corresponding to the plurality of magnetoresistance patterns constituting the MR element serving as the magnetic field detecting element, wherein the MR element is disposed so that the center of the gap between the magnetoresistance patterns is substantially coincident in location with the one magnet's end facing the other magnet. With this construction, the magnitude of the magnetic field applied to the respective magnetoresistance patterns varies depending on whether the MR element faces a protruding portion or a recessed portion of the rotary magnetic material member. This makes it possible to obtain a signal exactly corresponding to the protruding and recessed portions of the rotary magnetic material member. In this embodiment, unlike the conventional technique, it is not required to detect the edges of the protruding and recessed portions of the rotary member. Furthermore, the holding circuit which is necessary in the conventional sensing device is no longer needed. When the electric power to the sensing device is turned on, the sensing device can immediately start a correct operation and can provide an output signal exactly corresponding to the protruding and recessed portions of the rotary magnetic material member. Thus, the sensing device according to the present embodiment has the "quick starting" capability with high reliability.

Embodiment 2

Figure 18A:
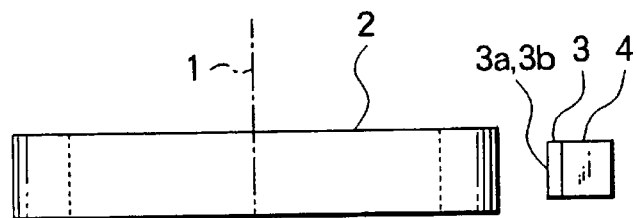
FIGS. 18A and 18B are schematic diagrams illustrating a conventional sensing device.
Figure 18B:
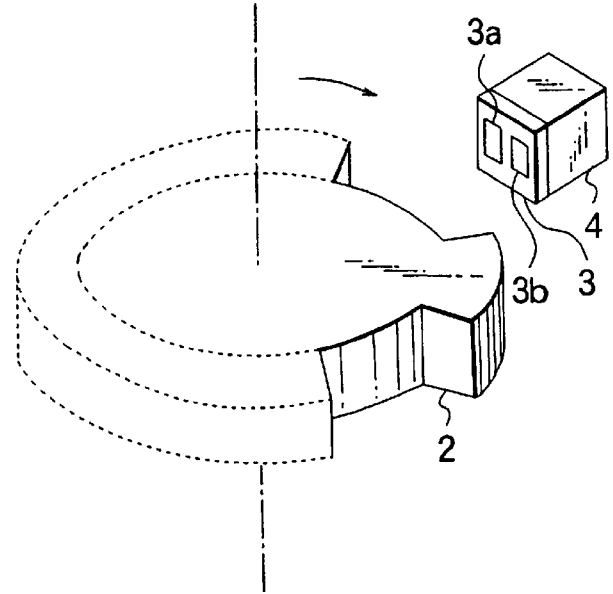
Figure 19:
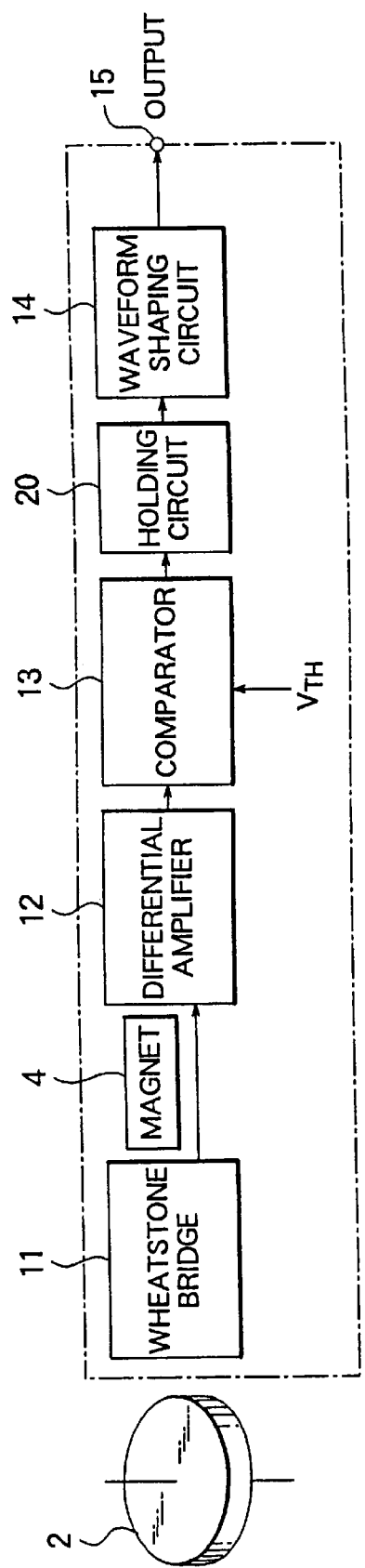
FIG. 19 is a block diagram illustrating the circuit configuration of the conventional sensing device.
Figure 22:
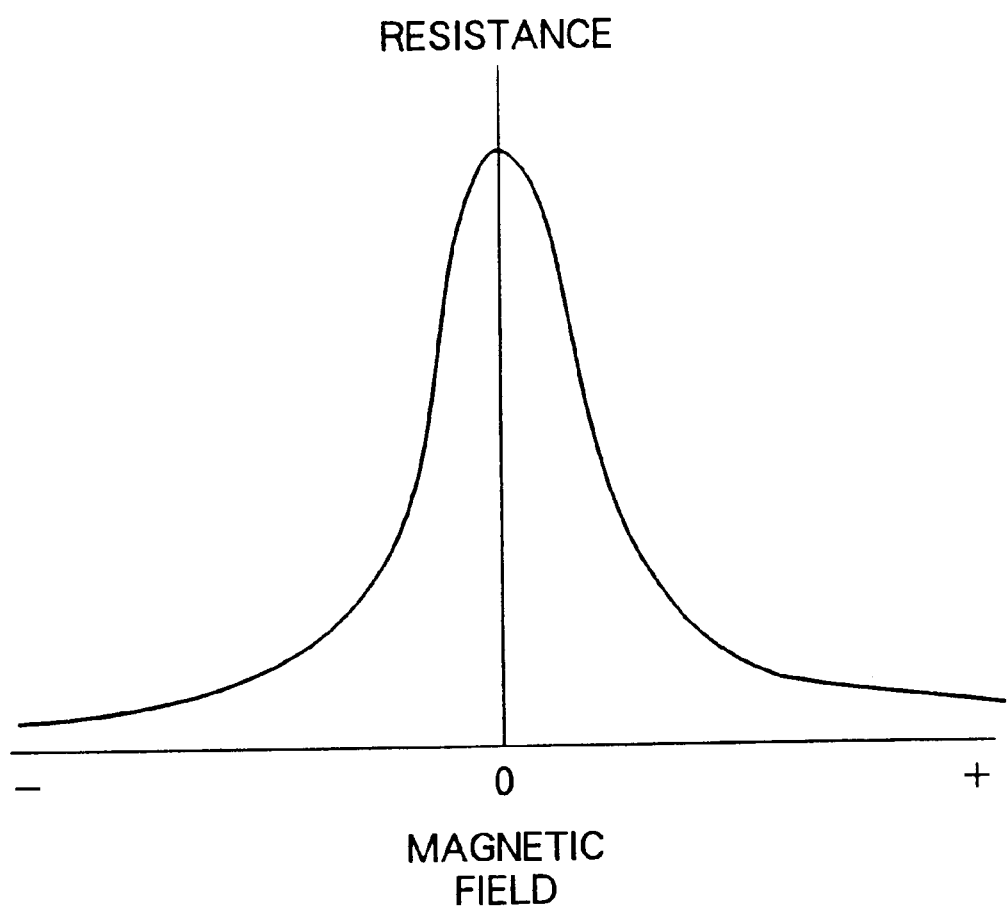
FIG. 22 is a graph illustrating the resistance of an MR element as a function of the applied magnetic field.

FIG. 6 is a schematic diagram illustrating a second embodiment of the invention wherein FIGS. 18A and 18B are a side view and a perspective view thereof, in which similar elements and parts to those in FIG. 1 are denoted by similar reference numerals, and they are not described in further detail here.

This sensing device includes: a rotating shaft 1; a rotating member of magnetic material 2 serving as magnetic field variation inducing means having at least one protruding or recessed portion and being adapted to rotate in synchronization with the rotation of the rotating shaft 1; a magnetic field detecting element such as an MR element 3 disposed at a location a predetermined distance apart from the rotary magnetic material member 2; and a ring-shaped magnet 23 serving as magnetic field generating means for applying a magnetic field to the MR element 3. If it is assumed here that the rotary magnetic material member 2 rotates clockwise as shown in FIG. 6, the MR element 3 is shifted in a forward direction of the rotation so that the MR element 3 is located at an extreme end on the inner peripheral edge of the ring-shaped magnet 23. More specifically, the MR element 3 is located so that the center of the gap between the magnetoresistance patterns 3a and 3b is substantially coincident in location with the inner periphery of the ring-shaped magnet 23 as shown in FIG. 7.

If the rotary magnetic material member 2 rotates, the magnetic field applied to the magnetic field sensing plane of the magnetoresistance element 3 changes. In response to the change in the magnetic field, the resistance of the magnetoresistance patterns 3a and 3b changes.

Except for the above point, the construction of the present embodiment is similar to that shown in FIG. 1, and the circuit configuration is also similar to that shown in FIG. 2 or 3 except that the magnets 21 and 22 are replaced by the ring-shaped magnet 23, and no further description is given here.

Figure 8:
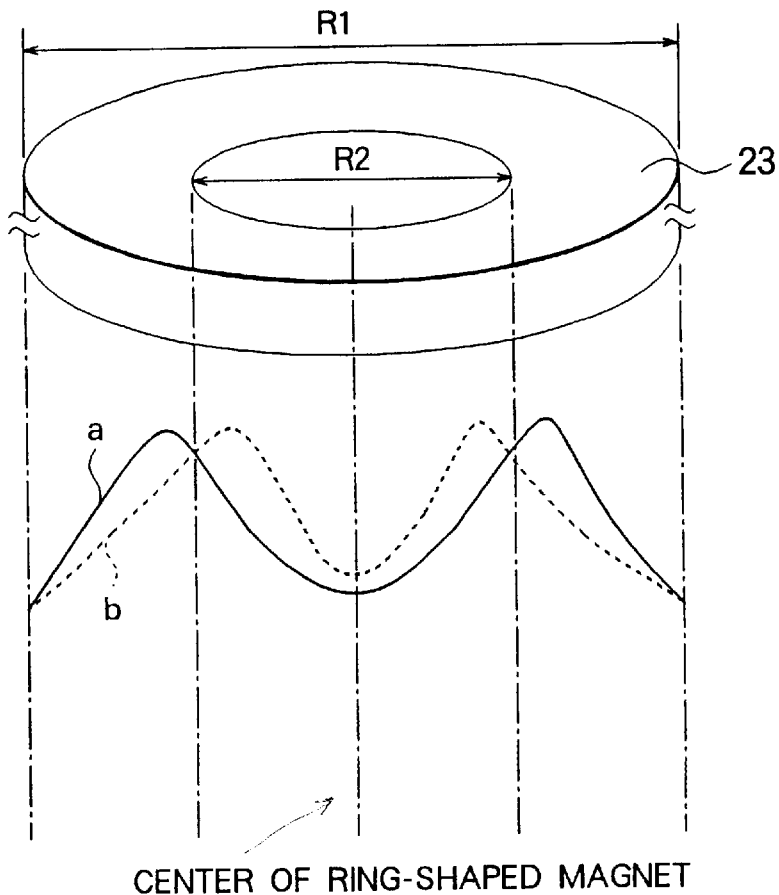
FIG. 8 illustrates the resistance of the magnetic field detecting element as a function of the relative location of the magnetic field detecting element with respect to the ring-shaped magnet, according to the second embodiment of the invention.
Figure 9:
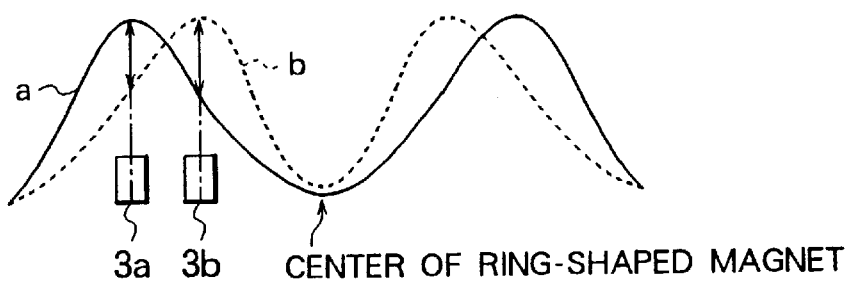
FIG. 9 is a schematic diagram illustrating the location of a magnetic field detecting element relative to the location of a ring-shaped magnet according to the second embodiment of the invention.

FIG. 8 illustrates the resistance of a magnetoresistance pattern as a function of the relative location of the MR element 3 serving as the magnetic field detecting element with respect to the ring-shaped magnet 23 for the protruding and recessed portions of the rotary magnetic material member 2.

That is, FIG. 8 illustrates the change in the resistance of a magnetoresistance pattern of the MR element which occurs when the MR elements are moved along a path a fixed distance apart from the magnet 23 and in a direction parallel to the magnet 23, wherein the magnet 23 has an outer diameter R1 and an inner diameter R2. In FIG. 8, the solid line represents the resistance for a protruding portion and the broken line represents the resistance for a recessed portion. In either case, as can be seen from FIG. 8, the resistance of the magnetoresistance pattern of the MR element has a maximum value at locations near both ends of the inner diameter R2 of the ring-shaped magnet 23. More exactly, when the magnetoresistance pattern faces a protruding portion, the maximum points are located slightly outward from the ends of the inner diameter R2 of the ring-shaped magnet 23, whereas the maximum points are located slightly inward from the ends of the inner diameter R2 of the ring-shaped magnet 23 when the magnetoresistance pattern faces a recessed portion.

In the present embodiment, as described above, the MR element 3 is located so that the center of the gap between the magnetoresistance patterns 3a and 3b is substantially coincident in location with an edge of the inner periphery of the ring-shaped magnet 23. Under such positional condition, the magnetoresistance pattern 3a is located at a maximum point on the solid line a representing the resistance for a protruding portion, and the magnetoresistance pattern 3b is located at a maximum point of the broken line b representing the resistance for a recessed portion.

As a result of the above arrangement, the magnetoresistance patterns 3a and 3b have different resistances depending on whether the magnetoresistance patterns 3a and 3b face a protruding portion or a recessed portion. When the magnetoresistance patterns 3a and 3b face a protruding portion, the magnetoresistance pattern 3a has a larger resistance than the magnetoresistance pattern 3b, whereas the magnetoresistance pattern 3b has a larger resistance than the magnetoresistance pattern 3a when the magnetoresistance patterns 3a and 3b face a recessed portion.

Thus, in response to the relative position with respect to the protruding and recessed portions of the rotary magnetic material member 2, the resistances of the magnetoresistance patterns 3a and 3b vary in opposite directions to each other. As a result, the bridge circuit constructed with these magnetoresistance patterns can produce a great output voltage.

The difference between the mid-point voltages obtained in the above-described manner is amplified by the differential amplifier 12 shown in FIG. 3. The differential amplifier 12 outputs a signal corresponding to the protruding and recessed portions of the rotary magnetic material member 2, wherein the output signal is different in level and opposite in polarity for the protruding and recessed portions.

The output of the differential amplifier 12 is supplied to the comparator 13, and is compared with the reference value, or threshold value, $V_{TH}$. The comparator 13 outputs a "0" or "1" signal in accordance with the comparison result. The waveform of this signal is then shaped by the waveform shaping circuit 14. As a result, an output signal having a "0" or "1" level with sharply rising and falling edges is obtained via the output terminal 15, wherein the output signal exactly corresponds to the protruding and recessed portions of the rotary magnetic material member 2.

Although above the rotary magnetic material member 2 rotates clockwise and the location of the MR element 3 is shifted in the forward direction of the rotation of the rotary magnetic material member 2 so that the center of the gap between the magnetoresistance patterns 3a and 3b is coincident in location with an inner peripheral edge (the leftmost end of the inner periphery of the ring-shaped magnet 23, in FIG. 7) of the ring-shaped magnet 23, the rotary magnetic material member 2 may also rotate counterclockwise and the location of the MR element 3 may be shifted in the forward direction of the rotation of the rotary magnetic material member 2 so that the center of the gap between the magnetoresistance patterns 3a and 3b is coincident in location with an inner peripheral edge (the rightmost end of the inner periphery of the ring-shaped magnet 23, in FIG. 7) of the ring-shaped magnet 23.

In the present embodiment, as described above, the sensing device includes the ring-shaped magnet corresponding to the plurality of magnetoresistance patterns constituting the MR element serving as the magnetic field detecting element, wherein the MR element is disposed so that the center of the gap between the magnetoresistance patterns is substantially coincident in location with the edge of the inner periphery of the ring-shaped magnet. With this construction, the magnitude of the magnetic field applied to the respective magnetoresistance patterns varies depending on whether the MR element faces a protruding portion or a recessed portion of the rotary magnetic material member. This makes it possible to obtain a signal exactly corresponding to the protruding and recessed portions of the rotary magnetic material member. Furthermore, the sensing device of the present embodiment requires only one magnet and, thus, it can be implemented in a small size.

Embodiment 3

Figure 10:
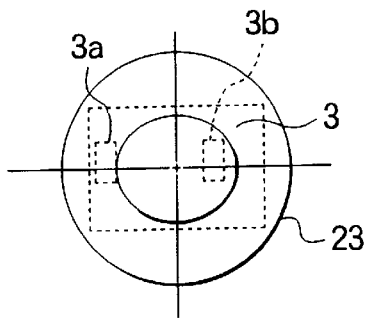
FIG. 10 is a schematic diagram illustrating a third embodiment of a sensing device according to the present invention.

FIG. 10 is a schematic diagram illustrating a third embodiment of the invention, wherein similar elements and parts to those in FIG. 6 are denoted by similar reference numerals, and they are not described here in further detail. The present embodiment is similar to that shown in FIG. 2 in terms of the location of an MR element relative to the location of a rotary magnetic material member, except that magnetoresistance patterns are disposed at different locations with respect to the location of a ring-shaped magnet. Furthermore, the circuit configuration is similar to that shown in FIG. 2 or 3 except that the magnets 21 and 22 are replaced by the ring-shaped magnet 23, and no further description is given here.

An additional and particular purpose of the present embodiment is to reduce the effect of the positioning error of the MR element 3, with respect to the location of the ring-shaped magnet 23, on the detection accuracy.

In this embodiment, the MR element 3 includes a plurality of magnetic field detecting elements which are spaced from each other by an amount equal to the inner diameter of the ring-shaped magnet 23, and the MR element 3 is disposed in such a manner that one magnetic field detecting element is located at a position shifted slightly outward from the inner periphery of the ring-shaped magnet 23, and the other magnetic field detecting element is located at a position shifted slightly inward from the inner periphery. That is, as shown in FIG. 10, the center of the MR element 3 is shifted from the center of the ring-shaped magnet 23 in a forward direction of the rotation (clockwise rotation) of the rotary magnetic material member 2 (refer to FIG. 6) so that the magnetoresistance pattern 3a is located slightly outward from the inner peripheral edge of the ring-shaped magnet 23, and the magnetoresistance pattern 3b is located slightly inward from the inner peripheral edge of the ring-shaped magnet 23, thereby producing symmetrical changes in the resistance of the magnetoresistance patterns 3a and 3b about the center of the ring-shaped magnet 23.

Figure 11:
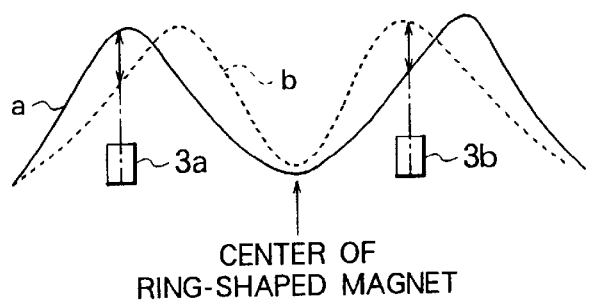
FIG. 11 is a schematic diagram illustrating the location of a magnetic field detecting element relative to the location of a ring-shaped magnet according to the third embodiment of the invention.

In other words, the magnetoresistance pattern 3a is located at a position where the resistance characteristic represented by the solid line a in FIG. 11 for a protruding portion of the rotary magnetic material member 2 has a maximum value, and the magnetoresistance pattern 3b is located at a position where the resistance characteristic represented by the broken line b in FIG. 11 for a recessed portion of the rotary magnetic material member 2 has a maximum value, wherein the location of the magnetoresistance pattern 3b and the location of the magnetoresistance pattern 3a are on opposite sides of the center of the magnet 23.

As a result of the above arrangement, the magnetoresistance patterns 3a and 3b have different resistances depending on whether the magnetoresistance patterns 3a and 3b face a protruding portion or a recessed portion. When the magnetoresistance patterns 3a and 3b face a protruding portion, the magnetoresistance pattern 3a has a larger resistance than the magnetoresistance pattern 3b, whereas the magnetoresistance pattern 3b has a larger resistance than the magnetoresistance pattern 3a when the magnetoresistance patterns 3a and 3b face a recessed portion.

Thus, in response to the relative position with respect to the protruding and recessed portions of the rotary magnetic material member 2, the resistances of the magnetoresistance patterns 3a and 3b vary in opposite directions to each other. This leads to a great difference in the output voltages of the bridge circuit.

Referring to FIG. 12, the characteristics of the sensing device will be discussed in further detail for the case where the magnetoresistance patterns 3a and 3b of the MR element 3 are shifted from the normal locations with respect to the location of the ring-shaped magnet 23.

Figure 12A:
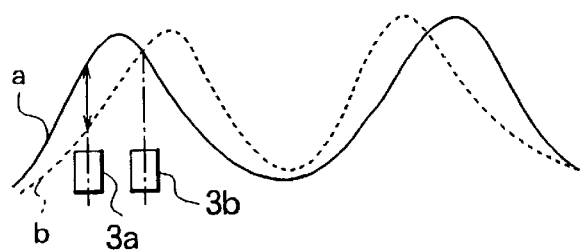
FIGS. 12A and 12B are schematic diagrams illustrating the effects of positional shift of a magnetic field detecting element relative to the location of a ring-shaped magnet for both sensing devices according to the second and third embodiments of the invention.

In the second embodiment described above, if the magnetoresistance patterns 3a and 3b are shifted from normal positions with respect to the ring-shaped magnet 23, the resistances of the magnetoresistance patterns 3a and 3b will become as shown in FIG. 12A. In the present variation on the other hand, if the magnetoresistance patterns 3a and 3b are shifted from their normal positions with respect to the ring-shaped magnet 23, the resistances of the magnetoresistance patterns 3a and 3b will become as shown in FIG. 12B.

Figure 12B:
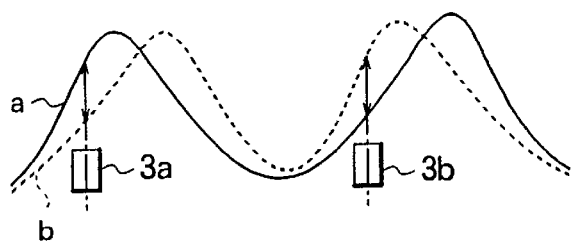

In the case of the second embodiment shown in FIG. 12A, the variations in the resistances of the magnetoresistance patterns 3a and 3b decrease to extremely small levels compared to those of the present embodiment shown in FIG. 12B.

This means that the present embodiment provides a greater margin associated with the positioning error of the MR element relative to the location of the ring-shaped magnet.

In the case where the rotary magnetic material 2 rotates counterclockwise as opposed to the example shown in FIG. 10, the MR element 3, including the magnetoresistance patterns 3a and 3b spaced from each other by an amount equal to the inner diameter of the ring-shaped magnet 23, is disposed in such a manner that the center of the MR element 3 is shifted from the center of the ring-shaped magnet 23 in the forward direction of the rotation of the rotary magnetic material member 2 so that the magnetoresistance pattern 3a is located slightly inward from the inner peripheral edge of the ring-shaped magnet 23 and the magnetoresistance pattern 3b is located slightly outward from the inner peripheral edge of the ring-shaped magnet 23, thereby producing symmetrical changes in the resistance of the magnetoresistance patterns 3a and 3b about the center of the ring-shaped magnet 23.

In this case, the magnetoresistance pattern 3a is located at a position corresponding to a peak of the resistance characteristic for a recessed portion of the rotary magnetic material member 2, represented by the broken line b in FIG. 11, whereas the magnetoresistance pattern 3b is located at a position corresponding to a peak of the resistance characteristic for a protruding portion, represented by the solid line a in FIG. 11, wherein the magnetoresistance patterns 3a and 3b are located opposite each other via the center of the ring-shaped magnet 23.

The difference between the mid-point voltages, obtained in the above-described manner, is amplified by the differential amplifier 12 shown in FIG. 3. The differential amplifier 12 outputs a signal corresponding to the protruding and recessed portions of the rotary magnetic material member 2, wherein the output signal for protruding portions is different in level and opposite in polarity from that for recessed portions.

The output of the differential amplifier 12 is supplied to the comparator 13, and is compared with the reference value, or threshold value, $V_{TH}$. The comparator 13 outputs a "0" or "1" signal in accordance with the comparison result. The waveform of this signal is then shaped by the waveform shaping circuit 14. As a result, an output signal having a "0" or "1" level with sharply rising and falling edges is obtained via the output terminal 15, wherein the output signal exactly corresponds to the protruding and recessed portions of the rotary magnetic material member 2.

In the present embodiment, as described above, the magnetoresistance patterns of the MR element serving as the magnetic field detecting elements are spaced from each other by an amount equal to the inner diameter of the ring-shaped magnet, and the MR element is located at a position shifted in either direction depending on the rotation direction of the rotary magnetic material member, so that the plurality of magnetoresistance patterns change in resistance symmetrically about the center of the ring-shaped magnet. In this arrangement, each magnetoresistance pattern of the MR element experiences a magnetic field which varies in magnitude depending on whether the magnetoresistance patterns face a protruding or recessed portion of the rotary magnetic material member. This makes it possible to obtain a signal exactly corresponding to the protruding and recessed portions of the rotary magnetic material member as in the second embodiment described above. An additional and particular feature of the present embodiment is that a great margin can be obtained in terms of the positioning error of the MR element relative to the location of the ring-shaped magnet.

Embodiment 4

Figure 13:
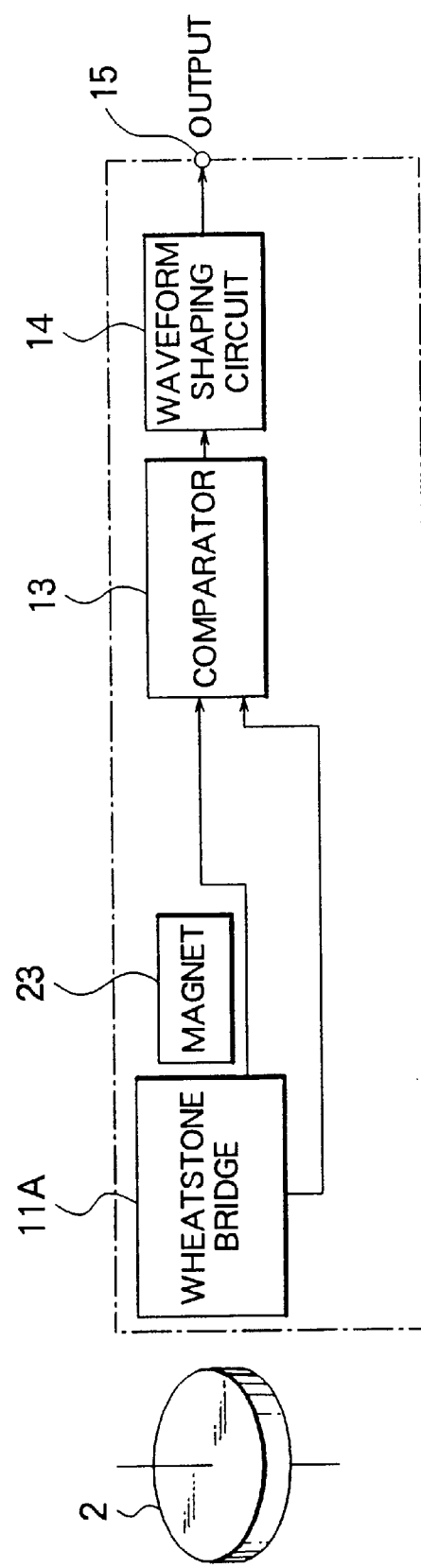
FIG. 13 is a block diagram illustrating the circuit configuration of a sensing device according to a fourth embodiment of the invention.

FIG. 13 is a block diagram illustrating a fourth embodiment of the invention, wherein similar elements or parts to those in FIG. 2 are denoted by similar reference numerals and they are not described in further detail here. In this embodiment, the location of a magnetic field detecting element relative to a rotary magnetic material member is set in a similar fashion to the embodiment described above with reference to FIG. 6.

To achieve an output signal which exactly changes in accordance with the protruding and recessed portions of the rotary magnetic material member, the magnetic field detecting element is realized using giant magnetoresistance (GMR) elements.

The GMR element has a multilayer structure consisting of alternating magnetic layers and non-magnetic layers each having a thickness in the range from a few Å to a few tens 0f Å. Such a multilayer structure is known as the superlattice structure, and a specific example is disclosed in a paper entitled "Magnetoresistance effect of superlattice" published in the Journal of Magnetics Society of Japan, Vol. 15, No. 51991, pp. 813–821. Specific structures includes (Fe/Cr)n, (permalloy/Cu/Co/Cu)n, (Co/Cu)n, etc. These superlattice structures exhibit much greater magnetoresistance effect (change in magnetoresistance) than conventional MR devices. In these GMR elements with superlattice structure, the magnetoresistance effect depends only on the relative angle between magnetization of adjacent magnetic layers, and therefore the change in resistance does not depend on the direction of the external magnetic field applied with respect to the direction of current (this property is referred to as "in-plane magnetic field sensitivity).

The features of the GMR elements are hysteresis in the resistance versus applied magnetic field characteristic and a large temperature coefficient.

FIG. 13 is a block diagram illustrating the circuit configuration of a sensing device using GMR elements having the property of hysteresis.

This sensing device includes: a Wheatstone bridge circuit 11A including GMR elements disposed at a predetermined distance from the rotary magnetic material member 2, so that a magnetic field is applied from a ring-shaped magnet 23 to the GMR elements; a comparator 13 for comparing the mid-point voltages of the Wheatstone bridge circuit 11A with each other and outputting a "0" signal or a "1" signal in accordance with the comparison result; a waveform shaping circuit 14 for shaping the waveform of the output of the comparator 13 and supplying a "0" or "1" signal having sharply rising and falling edges to an output terminal 15. The above comparator 13 and the waveform shaping circuit 14 form a signal processing means.

FIG. 14 illustrates a specific example of the circuit shown in the block diagram of FIG. 13.

The Wheatstone bridge circuit 11A includes GMR elements 24A and 24B and fixed resistors 24C and 24D located on the respective branches of the Wheatstone bridge circuit, wherein one end of the GMR element 24A and one end of the fixed resistor 24C are connected in common to a power supply terminal $V_{cc}$ via a node 16, one end of the GMR element 24B and one end of the fixed resistor 24D are connected in common to ground via a node 17, the other end of the GMR element 24A and the other end of the GMR element 24B are connected to a node 18, and the other end of the fixed resistor 24C and the other end of the fixed resistor 24D are connected to a node 19. In this embodiment, the GMR elements 24A and 24B correspond to magnetoresistance patterns 24a and 24b (refer to FIG. 16) which are located at positions relative to a ring-shaped magnet 23 in a similar manner to the magnetoresistance patterns 3a and 3b described above with reference to FIG. 6. The GMR element 24 is located so that the center of the gap between the magnetoresistance patterns 24a and 24b is substantially coincident in location with an inner peripheral edge of the ring-shaped magnet 23. In this embodiment, the fixed resistors 24C and 24D may also be replaced by GMR elements.

The node 18 of the Wheatstone bridge circuit 4A is connected via a resistor to the non-inverting terminal of the comparator 13, and the node 19 is connected via a resistor to the inverting input of the comparator 13. The inverting input of the comparator 13 is also connected via a resistor to the output of the comparator 13.

The output of the comparator 13 is connected to the base of a transistor 14a of a waveform shaping circuit 14 and is also connected via a resistor to the power supply terminal $V_{cc}$. The collector of the transistor 14a is connected to the output terminal 15 and also to the power supply terminal $V_{cc}$ via a resistor. The emitter of the transistor 14a is grounded.

In the present embodiment, the GMR elements are adapted to have proper hysteresis in the characteristic of resistance versus applied magnetic field by optimizing the film thicknesses of the magnetic and non-magnetic layers within the range from a few Å to a few tens of Å.

Now the operation will be described below with reference to FIG. 15.

If the rotary magnetic material member 2 rotates, the magnetic field applied to the GMR elements 24A and 24B of the Wheatstone bridge circuit 11A changes in response to the passage of the protruding and recessed portions of the rotary magnetic material member 2 shown in FIG. 15A, wherein the magnetic field applied to the GMR element 24A is different from that applied to the GMR element 24B. As a result, the magnetic field sensing planes of the GMR elements 24A and 24B experience the change in the magnetic field corresponding to the protruding and recessed portions of the rotary magnetic material member 2. Thus, the overall magnitude of the change in the magnetic field becomes, in effect, two times greater than that which can be sensed by a single GMR element, and a corresponding change in resistance occurs in each GMR element. The GMR element 24A has maximum and minimum resistances at locations opposite in phase to those where the GMR element 24B has maximum and minimum resistances. As a result, the voltages at the nodes 18 and 19 (mid-point voltages) of the Wheatstone bridge circuit 11A also change in a similar fashion, wherein there is a great difference between these mid-point voltages $V_1$ and $V_2$ as shown in FIG. 15B.

FIG. 15B illustrates the mid-point voltages $V_1$ and $V_2$ at the nodes 18 and 19 of the Wheatstone bridge circuit 11A obtained when the Wheatstone bridge 11A, including the GMR elements 24A and 24B, is connected to a power supply $V_{cc}$, and the rotary magnetic material member 2 (refer to FIG. 6) is rotated, wherein the mid-point voltages are shown for various distances between the GMR elements and the rotary magnetic material member 2 (hereinafter such distance will be referred to simply as the gap).

At the transition from a recessed portion to a protruding portion or from a protruding portion to a recessed portion of the rotary magnetic material member, the mid-point voltage $V_1$ at the node 18 of the GMR elements 24A and 24B passes a certain point which is fixed regardless of the magnitude of the gap, as can be seen from FIG. 15B.

If the slice level of the comparator 13, which is given by the mid-point voltage $V_2$ at the node 19 between the fixed resistors 24C and 24D, is set to the above-described fixed point by properly selecting the resistance of the fixed resistors 24C and 24D, it is possible to minimize the gap-dependent deviation of the transition edges corresponding to the protruding and recessed portions of the rotary magnetic material member 2.

Figure 16:
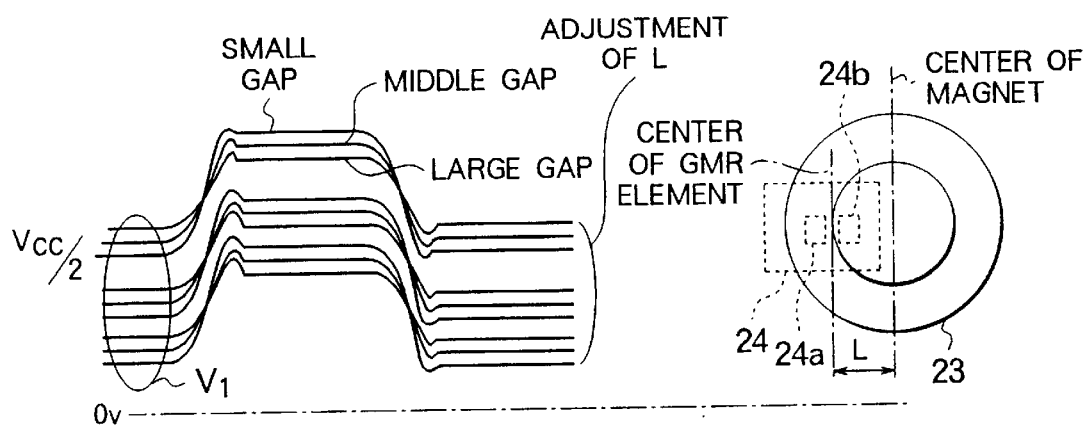
FIG. 16 is a schematic diagram illustrating the compensation for the temperature characteristic of the sensing device according to the fourth embodiment of the invention.
Figure 17:
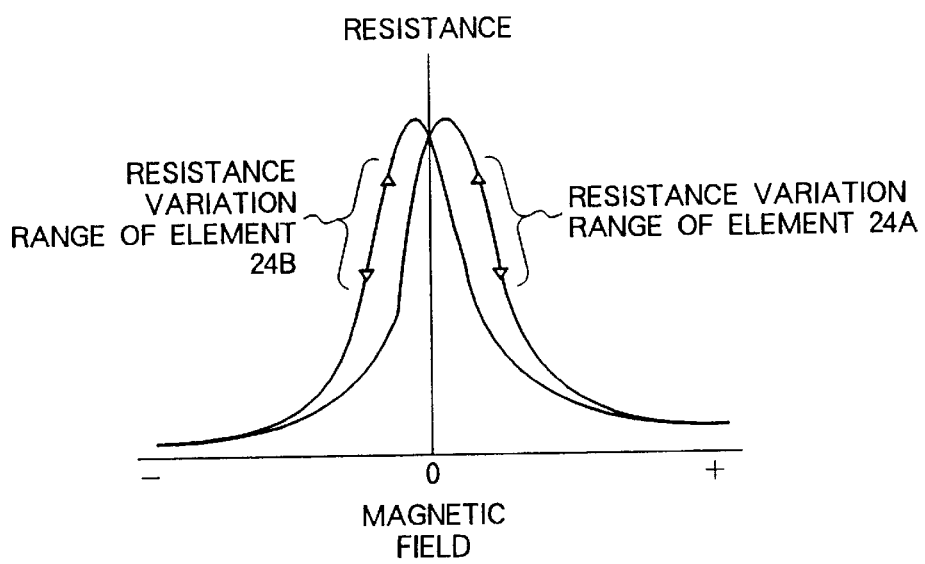
FIG. 17 is a graph illustrating the resistance of a GMR element as a function of the applied magnetic field.

FIG. 16 illustrates the change in the mid-point voltage $V_1$ at the node 18 for various amounts of distance L between the ring-shaped magnet 23 and the magnetoresistance patterns 24a, 24b constituting the GMR element 24.

As can be seen from FIG. 16, if the distance L is properly selected, it is possible to make the mid-point voltage $V_1$ at the node 18 pass a fixed point at a level equal to ½ $V_{cc}$ regardless of the variation in the gap.

In FIG. 16, if the distance L is greater than a proper value, the magnetoresistance pattern 24b (GMR element 24B) has a larger resistance than the magnetoresistance pattern 24a (GMR element 24A) and thus the mid-point voltage $V_1$ is shifted upward from ½ $V_{cc}$. On the other hand, if the distance L is smaller than the proper value, the magnetoresistance pattern 24b (GMR element 24B) has a smaller resistance than the magnetoresistance pattern 24a (GMR element 24A) and thus the mid-point voltage $V_1$ is shifted downward from ½ $V_{cc}$.

In the present embodiment, as described above, the slice level of the comparator 13, which is given by the mid-point voltage $V_2$ at the node 19 between the fixed resistors 24C and 24D, is set to a value equal to ½ $V_{cc}$ corresponding to the above-described fixed point associated with the mid-point voltage $V_1$ at the node 18. The mid-point voltage $V_1$ passes the fixed point at the level equal to ½ $V_{cc}$ when the magnetoresistance patterns 24a and 24b, or the GMR elements 24A and 24B, are equal in resistance to each other. Furthermore, both GMR elements 24A and 24B can have an equal temperature coefficients. Therefore, no deviation of the mid-point voltage $V_1$ at the node 18 due to the variation in temperature occurs. Thus, it is possible to reduce the effects of temperature variation on the detection of the rotary magnetic material member 2.

The mid-point voltages $V_1$ and $V_2$ obtained at the nodes 18 and 19 of the Wheatstone bridge circuit 11A are supplied to the comparator 13. In the comparator 13, these mid-point voltage $V_1$ and $V_2$ are compared with each other, wherein the mid-point voltage $V_1$ acts as an input signal to be detected and the mid-point voltage $V_2$ acts as a slice level. The comparator 13 outputs a "0" or "1" signal in accordance with the comparison result. The waveform of this output signal is then shaped by the waveform shaping circuit 14. As a result, as shown in FIG. 15C, an output signal having a "0" or "1" level with sharply rising and falling edges is obtained via the output terminal 15, wherein the output signal exactly corresponds to the protruding and recessed portions of the rotary magnetic material member 2.

Thus, in the present embodiment, it is possible to obtain a signal exactly corresponding to the protruding and recessed portions of the rotary magnetic material member without having to detect the edges of the protruding and recessed portions of the rotary member and without having to use a holding circuit required in the conventional technique,. Furthermore, in the present embodiment, it is possible to obtain an output signal which precisely corresponds to the protruding and recessed portions of the rotary magnetic material member as soon as the electric power of the sensing device is turned on, and, thus, it is possible to achieve a quick starting operation with high reliability.

In the present embodiment, as described above, the plurality of magnetoresistance patterns, constituting the GMR element serving as the magnetic field detecting element, are disposed at particular locations relative to the ring-shaped magnet such that the center of gap between the plurality of magnetoresistance patterns is substantially coincident with an inner peripheral edge of the ring-shaped magnet, so that the difference between the magnitudes of the magnetic fields applied to the respective magnetoresistance patterns of the GMR element becomes inverted depending on whether the GMR element faces a protruding portion or a recessed portion of the rotary magnetic material member. This makes it possible to obtain a signal exactly corresponding to the protruding and recessed portions of the rotary magnetic material member, as in the first through third embodiments described above. Furthermore, in this embodiment, the mid-point voltages of the bridge circuit including the GMR elements serving as the magnetic field detecting elements cross each other at a fixed point, at the level equal to ½ $V_{cc}$ regardless of the magnitude of the gap and, thus, no differential amplifier is required at a stage following the bridge circuit. This allows simplification in the circuit configuration. Furthermore, no deviation in the mid-point voltages of the bridge circuit occurs regardless of temperature variation and, thus, the effects of temperature variation on the detection of the rotary magnetic material member are reduced.

Embodiment 5

In the previous embodiments, the moving member of magnetic material serving as the magnetic field variation inducing means is adapted to rotate in synchronization with the rotating shaft. However, the moving member of magnetic material may also be adapted to move along a straight line. Although the Wheatstone bridge circuit constructed with magnetic field detecting elements is employed in the embodiments described above, other similar bridge circuit configurations may also be employed.

What is claimed is:

1. A sensing device comprising:

magnetic field generating means for generating a magnetic field, said magnetic field generating means comprising a plurality of magnets;

magnetic field variation inducing means for changing the magnetic field generated by said magnetic field generation means, said magnetic field variation inducing means being disposed a predetermined distance apart from said magnetic field generation means; and a plurality of magnetic field detecting elements which change in resistance in response to the magnetic field whose magnitude is changed by said magnetic field variation inducing means, said detecting elements disposed between said generating means and said inducing means, wherein said plurality of magnetic field detecting elements are disposed so that the midpoint thereof in a lateral direction is coincident in location with a side of one of said plurality of magnets, said side facing another magnet.

2. A sensing device comprising:

magnetic field generating means for generating a magnetic field, said magnetic field generating means comprising a single ring-shaped magnet;

magnetic field variation inducing means for changing the magnetic field generated by said magnetic field generation means, said magnetic field variation inducing means being disposed a predetermined distance apart from said magnetic field generation means; and a plurality of magnetic field detecting elements which change in resistance in response to the magnetic field whose magnitude is changed by said magnetic field variation inducing means, said detecting elements disposed between said generating means and said inducing means, wherein said plurality of magnetic field detecting elements are disposed in such a manner that the midpoint thereof in a lateral direction is coincident in location with an inner peripheral edge of said ring-shaped magnet.

3. A sensing device comprising:

magnetic field generating means for generating a magnetic field, said magnetic field generating means comprising a single ring-shaped magnet;

magnetic field variation inducing means for changing the magnetic field generated by said magnetic field generation means, said magnetic field variation inducing means being disposed a predetermined distance apart from said magnetic field generation means; and a plurality of magnetic field detecting elements which change in resistance in response to the magnetic field whose magnitude is changed by said magnetic field variation inducing means, said detecting elements disposed between said generating means and said inducing means, wherein said plurality of magnetic field detecting elements are spaced from each other by an amount equal to the inner diameter of said ring-shaped magnet and are disposed in such a manner that one of said plurality of magnetic field detecting elements is located at a position slightly shifted outward from an inner peripheral edge of said ring-shaped magnet and a second of said plurality of magnetic field detecting elements is located at a position shifted slightly inward from the opposite inner peripheral edge.

4. A sensing device as claimed in claim 1, wherein a bridge circuit is formed that includes said plurality of magnetic field detecting elements so that the polarity of a change of a magnetic field applied to one of said plurality of magnetic field detecting elements disposed on one branch of said bridge circuit is opposite to the polarity of a change of a magnetic field applied to another of said plurality of magnetic field detecting elements disposed on a second branch of said bridge circuit.

5. A sensing device as claimed in claim 2, wherein a bridge circuit is formed that includes said plurality of magnetic field detecting elements so that the polarity of a change of a magnetic field applied to one of said plurality magnetic field detecting elements disposed on one branch of said bridge circuit is opposite to the polarity of a change of a magnetic field applied to another of said plurality of magnetic field detecting elements.

6. A sensing device as claimed in claim 3, wherein a bridge circuit is formed that includes said plurality of magnetic field detecting elements so that the polarity of a change of a magnetic field applied to one of said plurality of magnetic field detecting elements disposed on one branch of said bridge circuit is opposite to the polarity of a change of a magnetic field applied to another of said plurality of magnetic field detecting elements.

7. A sensing device as claimed in claim 4, wherein said plurality of magnetic field detecting elements comprises a plurality of giant magnetoresistance elements.

8. A sensing device as claimed in claim 5, wherein said plurality of magnetic field detecting elements comprises a plurality of giant magnetoresistance elements.

9. A sensing device as claimed in claim 6, wherein said plurality of magnetic field detecting elements comprises a plurality of giant magnetoresistance elements.

10. A sensing device as claimed in claim 4, further comprising signal processing means for processing a signal output by said bridge circuit.

11. A sensing device as claimed in claim 5, further comprising signal processing means for processing a signal output by said bridge circuit.

12. A sensing device as claimed in claim 6, further comprising signal processing means for processing a signal output by said bridge circuit.

13. A sensing device as claimed in claim 10, wherein said signal processing means comprises:

a comparator for comparing a plurality of output signals of said bridge circuit with each other; and waveform shaping means for shaping the waveform of the output signal of said comparator.

14. A sensing device as claimed in claim 11, wherein said signal processing means comprises:

a comparator for comparing a plurality of output signals of said bridge circuit with each other; and waveform shaping means for shaping the waveform of the output signal of said comparator.

15. A sensing device as claimed in claims 12, wherein said signal processing means comprises:

a comparator for comparing a plurality of output signals of said bridge circuit with each other; and waveform shaping means for shaping the waveform of the output signal of said comparator.

16. A sensing device as claimed in claim 1, wherein said plurality of magnets are disposed in a side-by-side arrangement so that the North/South polarities of said magnets are in a same alignment with each other.

17. A sensing device comprising:

magnetic field generating means for generating a magnetic field, said magnetic field generating means comprising one of (1) a plurality of magnets arranged side-by-side with north/south polarities of said side-by-side magnets aligned in the same direction and (2) a single ring-shaped magnet, the magnetic field generating means having a center axis at a lateral midpoint of the magnetic field generating means;

magnetic field variation inducing means for changing the magnetic field generated by said magnetic field generation means, said magnetic field variation inducing means being disposed a predetermined distance apart from said magnetic field generation means; and a plurality of magnetic field detecting elements which change in resistance in response to the magnetic field whose magnitude is changed by said magnetic field variation inducing means, said plurality of magnetic field detecting elements having a midpoint in said lateral direction, said plurality of magnetic field detecting elements disposed between said magnetic field generating means and said magnetic field variation inducing means, wherein said plurality of magnetic field detecting elements are disposed so that the midpoint of said magnetic field detecting elements is disposed a predetermined lateral distance from said center axis of said magnetic field generating means so that the plurality of magnetic field detecting elements has a plurality of outputs with peak values different from each other.

* * * * *